(12) United States Patent
Cheng

(10) Patent No.: US 12,626,770 B2
(45) Date of Patent: May 12, 2026

(54) CONTROL GATE VOLTAGE GENERATING CIRCUIT FOR NON-VOLATILE MEMORY

(71) Applicant: eMemory Technology Inc., Hsin-Chu (TW)

(72) Inventor: Yu-Hsuan Cheng, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 171 days.

(21) Appl. No.: 18/795,606

(22) Filed: Aug. 6, 2024

(65) Prior Publication Data

US 2025/0061951 A1 Feb. 20, 2025

Related U.S. Application Data

(60) Provisional application No. 63/532,701, filed on Aug. 15, 2023.

(51) Int. Cl.
| | |
|---|---|
| *G11C 16/26* | (2006.01) |
| *G11C 5/14* | (2006.01) |
| *G11C 16/04* | (2006.01) |
| *G11C 16/08* | (2006.01) |
| *G11C 16/10* | (2006.01) |
| *G11C 16/16* | (2006.01) |
| *G11C 16/30* | (2006.01) |
| *H03K 3/356* | (2006.01) |

(Continued)

(52) U.S. Cl.
CPC .............. *G11C 16/30* (2013.01); *G11C 5/147* (2013.01); *G11C 16/0483* (2013.01); *G11C 16/08* (2013.01); *G11C 16/10* (2013.01); *G11C*

*16/16* (2013.01); *G11C 16/26* (2013.01); *H03K 3/356113* (2013.01); *H03K 19/0013* (2013.01); *H03K 19/018521* (2013.01); *G05F 3/262* (2013.01)

(58) Field of Classification Search
CPC ..... G11C 16/30; G11C 5/147; G11C 16/0483; G11C 16/08; G11C 16/10; G11C 16/16; G11C 16/26; G11C 16/28; H03K 3/356113; H03K 19/0013; H03K 19/018521; G05F 3/262
See application file for complete search history.

(56) References Cited

U.S. PATENT DOCUMENTS

| | | | | |
|---|---|---|---|---|
| 5,805,500 A | * | 9/1998 | Campardo | ............. G11C 16/28 365/185.21 |
| 6,791,890 B2 | * | 9/2004 | Ooishi | ................... G11C 29/02 365/201 |

(Continued)

*Primary Examiner* — Khamdan N. Alrobaie
(74) *Attorney, Agent, or Firm* — WPAT, PC

(57) ABSTRACT

A control gate voltage generating circuit for a non-volatile memory is provided. After the non-volatile memory leaves the factory, the control gate voltage is appropriately adjusted by the control gate voltage generating circuit according to the characteristics changes of the memory cells. When the read action is performed, the control gate voltage generating circuit provides the adjusted control gate voltage to the control gate line of the array structure. The magnitude of the reference current can be maintained in the range between the read current in the erase state and the read current in the program state. Consequently, the storage state of the selected memory cell can be accurately determined, and the life time of the non-volatile memory will be extended.

13 Claims, 4 Drawing Sheets

(51) Int. Cl.
    *H03K 19/00*     (2006.01)
    *H03K 19/0185*     (2006.01)
    *G05F 3/26*     (2006.01)

(56)           References Cited

U.S. PATENT DOCUMENTS

| 7,755,923 | B2 | 7/2010 | Liu | |
| 8,004,902 | B2 * | 8/2011 | Amanai | G11C 16/28 |
| | | | | 365/185.23 |
| 9,312,009 | B2 * | 4/2016 | Lai | G11C 16/08 |
| 2018/0336953 | A1 * | 11/2018 | Miyazaki | G11C 16/28 |
| 2022/0115063 | A1 * | 4/2022 | Chang | G11C 11/5628 |
| 2024/0161814 | A1 * | 5/2024 | Huang | H10D 30/6892 |

* cited by examiner

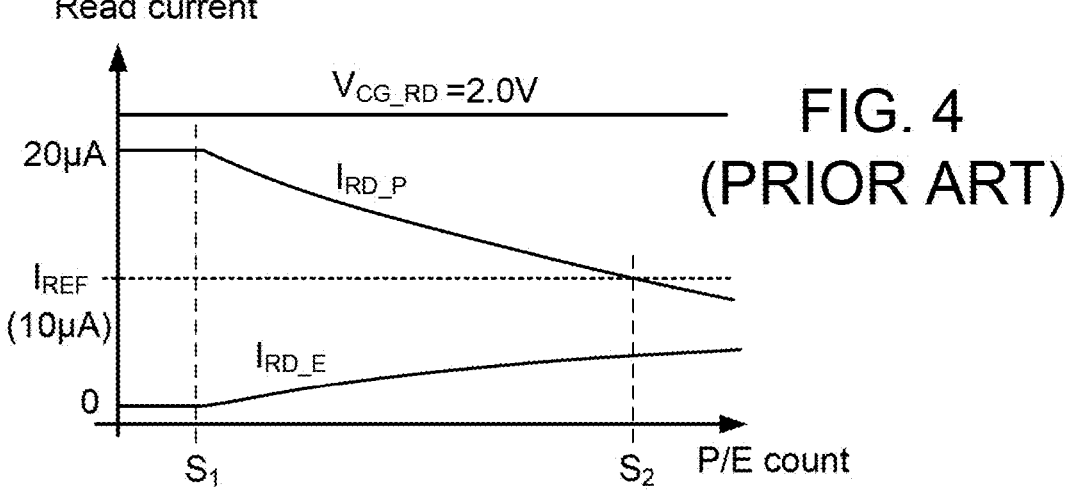

Source line voltage generator
310

$(V_{RD1})$
SL $(V_{CG\_RD})$
CGL

Control gate voltage generator
320

Array structure  360

$c_{1,1}$     $c_{1,2}$     $c_{1,3}$     $\cdots$     $c_{1,Y}$ $(V_{ON})$
$WL_1$ Word line driver
330

$WL_2$
$(V_{OFF})$ $c_{2,1}$     $c_{2,2}$     $c_{2,3}$     $\cdots$     $c_{2,Y}$ $WL_X$
$(V_{OFF})$

300

$\cdots$ $BL_1$     $BL_2$     $BL_3$     $BL_Y$
$(V_{RD2})$

Bit line driver  340

$I_{REF} \rightarrow$     Data sensor  350

$D_{OUT}$

FIG. 3 (PRIOR ART)

Read current $V_{CG\_RD} = 2.0V$

FIG. 4 (PRIOR ART)

20µA $I_{RD\_P}$ $I_{REF}$ (10µA)

$I_{RD\_E}$

0

$S_1$     $S_2$     P/E count

CONTROL GATE VOLTAGE GENERATING CIRCUIT FOR NON-VOLATILE MEMORY

This application claims the benefit of U.S. provisional application Ser. No. 63/532,701, filed Aug. 15, 2023, the subject matter of which is incorporated herein by references.

FIELD OF THE INVENTION

The present invention relates to an internal circuit of a non-volatile memory, and more particularly to a control gate voltage generating circuit for a non-volatile memory.

BACKGROUND OF THE INVENTION

As known, non-volatile memories have been widely used in a variety of electronic products such as SD cards or solid state drives (SSDs). Generally, a non-volatile memory comprises a memory array. The memory array comprises plural non-volatile memory cells. Each memory cell comprises a memory transistor. For example, the memory transistor is a charge-trap transistor or a floating gate transistor. Hereinafter, the structure of a memory cell will be described.

FIG. 1A is a schematic cross-sectional view illustrating a memory cell. FIG. 1B is an equivalent circuit of the memory cell shown in FIG. 1B. The memory cell 100 comprises a select transistor $M_S$ and a memory transistor $M_M$. For example, the select transistor $M_S$ and the memory transistor $M_M$ are p-type transistors.

As shown in FIG. 1A, three p-doped regions 51, 53 and 55 are formed under the surface of an N-well region NW. A gate structure 10 is located over the surface of the N-well region NW between the p-doped region 53 and the p-doped region 55. A gate structure 20 is located over the surface of the N-well region NW between the p-doped region 51 and the p-doped region 53. The gate structure 10 comprises a gate dielectric layer 11 and a select gate layer 13. The gate structure 20 comprises a charge storage structure 26 and a control gate layer 27. The charge storage structure 26 comprises a gate dielectric layer 21, a charge storage layer 23 and an isolation layer 25. The N-well region NW, the gate structure 10, the p-doped region 53 and the p-doped region 55 are collaboratively formed as the select transistor $M_S$. The N-well region NW, the gate structure 20, the p-doped region 51 and the p-doped region 53 are collaboratively formed as the memory transistor $M_M$.

The select gate layer 13 and the control gate layer 27 are polysilicon layers. In addition, the gate dielectric layers 11 and 21 and the isolation layer 25 are oxide layers, and the charge storage layer 23 is a nitride layer or a polysilicon layer. In other words, the charge storage structure 26 is an oxide-nitride-oxide (ONO) structure or an oxide-polysilicon-oxide structure. In case that the charge storage structure 26 is the oxide-nitride-oxide (ONO) structure, the memory transistor $M_M$ is a charge-trap transistor. In case that the charge storage structure 26 is the oxide-polysilicon-oxide structure, the memory transistor $M_M$ is a floating gate transistor.

The memory cell 100 is a four-terminal device. A first terminal $T_1$ of the memory cell 100 is electrically connected with the p-doped region 51. A second terminal $T_2$ of the memory cell 100 is electrically connected with the p-doped region 55. A control gate terminal $T_{CG}$ of the memory cell 100 is electrically connected with the control gate layer 27. A select gate terminal $T_{SG}$ of the memory cell 100 is electrically connected with the select gate layer 13.

As shown in FIG. 1B, the memory transistor $M_M$ comprises a charge storage layer 23. The first drain/source terminal of the memory transistor $M_M$ is connected with the first terminal $T_1$ of the memory cell 100. The second drain/source terminal of the memory transistor $M_M$ is connected with the first drain/source terminal of the select transistor $M_S$. The second drain/source terminal of the select transistor $M_S$ is connected with the second terminal $T_2$ of the memory cell 100. The select gate of the select transistor $M_S$ is connected with the select gate terminal $T_{SG}$ of the memory cell 100. The control gate of the memory transistor $M_M$ is connected with the control gate terminal $T_{CG}$ of the memory cell 100.

By providing proper bias voltages to the four terminals of the memory cell 100, a program action or an erase action can be performed on the memory cell 100. For example, in case that no carriers are stored in the charge storage layer 23 of the memory transistor $M_M$, the memory cell 100 is in an erase state. When the program action is performed on the memory cell 100, the carriers are injected into the charge storage layer 23 of the memory transistor $M_M$. Consequently, the carriers are stored in the charge storage layer 23 of the memory transistor $M_M$, and the memory cell 100 is in a program state. When the erase action is performed on the memory cell 100, the carriers are ejected from the charge storage layer 23 of the memory transistor $M_M$. Consequently, the memory cell 100 is in the erase state. For example, the carriers are electrons or holes.

FIG. 2A schematically illustrates the bias voltages for performing a read action on the memory cell shown in FIG. 1A, in which the memory cell is in the program state. FIG. 2B schematically illustrates the bias voltages for performing a read action on the memory cell shown in FIG. 1A, in which the memory cell is in the erase state.

When the read action is performed on the memory cell 100, a first read voltage $V_{RD1}$ is provided to the first terminal $T_1$, a second read voltage $V_{RD2}$ is provided to the second terminal $T_2$, an on voltage $V_{ON}$ is provided to the select gate terminal $T_{SG}$, and a gate control voltage $V_{CG\_RD}$ is provided to the control gate terminal $T_{CG}$. The first read voltage $V_{RD1}$ is higher than the second read voltage $V_{RD2}$. For example, the first read voltage $V_{RD1}$ is 2.5V, the second read voltage $V_{RD2}$ is 0.5V, the on voltage $V_{ON}$ is 0.5V, and the gate control voltage $V_{CG\_RD}$ is 2.0V.

Please refer to FIG. 2A again. When the select gate terminal $T_{SG}$ receives the on voltage $V_{ON}$, the select transistor $M_S$ is turned on, and a read current $I_{RD\_P}$ is generated by the memory cell 100. In addition, the read current $I_{RD\_P}$ flows from the first terminal $T_1$ to the second terminal $T_2$. Since carriers (e.g., electrons) are stored in the charge storage layer 23 of the memory transistor $M_M$, the magnitude of the read current $I_{RD\_P}$ generated by the memory cell 100 is higher.

Please refer to FIG. 2B again. When the select gate terminal $T_{SG}$ receives the on voltage $V_{ON}$, the select transistor $M_S$ is turned on, and a read current $I_{RD\_E}$ is generated by the memory cell 100. In addition, the read current $I_{RD\_E}$ flows from the first terminal $T_1$ to the second terminal $T_2$. Since no carriers are stored in the charge storage layer 23 of the memory transistor $M_M$, the magnitude of the read current $I_{RD\_E}$ generated by the memory cell 100 is lower. That is, the magnitude of the read current $I_{RD\_E}$ in the erase state is smaller than the magnitude of the read current $I_{RD\_P}$ in the program state.

For example, a data sensor of the non-volatile memory is equipped with a current comparator (not shown). The current comparator receives the read current and a reference current $I_{REF}$. The reference current $I_{REF}$ is set to be in the range between the read current $I_{RD\_E}$ in the erase state and the read current $I_{RD\_P}$ in the program state. If the read current $I_{RD\_P}$ is higher than the reference current $I_{REF}$, the current comparator judges that the memory cell 100 is in the program state. Whereas, if the read current $I_{RD\_E}$ is lower than the reference current $I_{REF}$, the current comparator judges that the memory cell 100 is in the erase state.

Furthermore, plural memory cells are collaboratively formed as an array structure. The array structure and a peripheral circuit are collaboratively formed as a non-volatile memory.

FIG. 3 schematically illustrates the architecture of a conventional non-volatile memory. As shown in FIG. 3, the non-volatile memory 300 comprises a source line voltage generator 310, a control gate voltage generator 320, a word line driver 330, a bit line driver 340, a data sensor 350 and an array structure 360.

The array structure 360 comprises X×Y memory cells $c_{1,1}$~$c_{X,Y}$, wherein X and Y are positive integers. For succinctness, only two rows of memory cells in the array structure 360 are shown in FIG. 3. The structure of each of the memory cells $c_{1,1}$~$c_{X,Y}$ is identical to the structure of the memory cell shown in FIGS. 1A and 1B, and not redundantly described herein.

In the first row of the array structure 360, the first terminals of the Y memory cells $c_{1,1}$~$c_{1,Y}$ are connected with a source line SL, the second terminals of the Y memory cells $c_{1,1}$~$c_{1,Y}$ are respectively connected with the corresponding bit lines $BL_1$~$BL_Y$, the select gate terminals of the Y memory cells $c_{1,1}$~$c_{1,Y}$ are connected with a word line $WL_1$, and the control gate terminals of the Y memory cells $c_{1,1}$~$c_{1,Y}$ are connected with a control gate line CGL. Similarly, in the second row of the array structure 360, the first terminals of the Y memory cells $c_{2,1}$~$c_{2,Y}$ are connected with the source line SL, the second terminals of the Y memory cells $c_{2,1}$~$c_{2,Y}$ are respectively connected with the corresponding bit lines $BL_1$~$BL_Y$, the select gate terminals of the Y memory cells $c_{2,1}$~$c_{2,Y}$ are connected with a word line $WL_2$, and the control gate terminals of the Y memory cells $c_{2,1}$~$c_{2,Y}$ are connected with the control gate line CGL. The rest may be deduced by analogy. In other words, all memory cells $c_{1,1}$~$c_{X,Y}$ of the array structure 360 are connected with the source line SL and the control gate line CGL.

The source line voltage generator 310 is connected with the source line SL. The control gate voltage generator 320 is connected with the control gate line CGL. The word line driver 330 is connected with the word lines $WL_1$~$WL_Y$. The bit line driver 340 is connected with the bit lines $BL_1$~$BL_Y$. Moreover, the data sensor 350 is connected with the bit line driver 340. The data sensor generates an output data $D_{OUT}$.

Generally, the source line voltage generator 310 and the control gate voltage generator 320 can provide proper bias voltages. In response to the associated bias voltages, the non-volatile memory 300 performs the program action, the erase action or the read action on the memory cells $c_{1,1}$~$c_{X,Y}$ of the array structure 360. An implementation example of the read action will be described as follows.

When the read action is performed, the source line voltage generator 310 provides a first read voltage $V_{RD1}$ (e.g., 2.5V) to the source line SL, and the control gate voltage generator 320 provides a control gate voltage $V_{CG\_RD}$ (e.g., 2.0V) to the control gate line CGL. Moreover, the word line driver 330 activates one of the X word lines $WL_1$~$WL_X$ to determine one of the X rows of the array structure 360 as a selected row. The bit line driver 340 activates at least one of the bit lines $BL_1$~$BL_Y$ to determine at least one selected memory cell of the selected row.

For example, the word line driver 330 provides an on voltage $V_{ON}$ (e.g., 0.5V) to the word line $WL_1$ and provides an off voltage VOFF (e.g., 2.5V) to the other word lines $WL_2$~$WL_X$. Under this circumstance, the word line $WL_1$ is activated by the word line driver 330, and the first row of the array structure 360 is served as the selected row. Moreover, in case that the bit line driver 340 provides a second read voltage $V_{RD2}$ (e.g., 0.5V) to the bit line $BL_1$ only, it means that only the bit line $BL_1$ is activated by the bit line driver 340, and only the memory cell $c_{1,1}$ in the selected row is the selected memory cell. Moreover, the read current generated by the selected memory cell $c_{1,1}$ is transferred to the data sensor 350 through the bit line driver 340. According to the result of comparing the read current of the selected memory cell $c_{1,1}$ with the reference current, the data sensor 350 judges the storage state of the selected memory cell $c_{1,1}$ and generates a one-bit output data $D_{OUT}$.

In case that the bit line driver 340 provides the second read voltage $V_{RD2}$ (e.g., 0.5V) to the bit lines $BL_1$~$BL_8$, the bit lines $BL_1$~$BL_8$ are activated. Under this circumstance, the memory cells $c_{1,1}$~$c_{1,8}$ in the selected row are the selected memory cells. Moreover, the read currents generated by the selected memory cells $c_{1,1}$~$c_{1,8}$ are transferred to the data sensor 350 through the bit line driver 340. Meanwhile, the data sensor 350 outputs a one-byte output data $D_{OUT}$ to indicate the storage states of the eight selected memory cells $c_{1,1}$~$c_{1,8}$.

As mentioned above, when the read action is performed, the source line voltage generator 310 and the control gate voltage generator 320 provide associated bias voltages to the source line SL and the control gate line CGL. Similarly, when the program action or the erase action is performed, the source line voltage generator 310 and the control gate voltage generator 320 provide associated bias voltages to the source line SL and the control gate line CGL. For example, when the program action is performed, the control gate voltage generator 320 provides a gate control voltage $V_{CG\_PGM}$ to the control gate line CGL. Moreover, when the erase action is performed, the control gate voltage generator provides a gate control voltage $V_{CG\_ERS}$ to the control gate line CGL. For example, the gate control voltage $V_{CG\_PGM}$ is 8.0V, and the gate control voltage $V_{CG\_ERS}$ is −10V.

Generally, after the memory cell has been programmed and eased many times, the characteristics of the memory cell become inferior. Due to the inferior characteristics, the read current $I_{RD\_P}$ generated by the memory cell in the program state gradually decreases, and the read current $I_{RD\_E}$ generated by the memory cell in the erase state gradually increases.

FIG. 4 is a plot illustrating the relationship between the program/erase cycling time (P/E count) and the read current for the conventional memory cell. Generally, after the conventional non-volatile memory leaves the factory, the reference current $I_{REF}$ and the gate control voltage $V_{CG\_RD}$ have been set. For example, the reference current $I_{REF}$ is set as 10 μA, and the gate control voltage $V_{CG\_RD}$ is set as 2.0V. That is, after the conventional non-volatile memory leaves the factory, the reference current $I_{REF}$ and the gate control voltage $V_{CG\_RD}$ cannot be changed.

Please refer to FIG. 4. In case that the P/E count of the memory cell is very low (e.g., lower than $S_1$), the memory cell has the better characteristics. For example, S1 is 300. Consequently, the read current $I_{RD\_P}$ generated by the memory cell in the program state is about 20 μA, and the read current $I_{RD\_E}$ generated by the memory cell in the erase state is very low (e.g., nearly zero). Under this circumstance, the data sensor 35 can judge the storage state of the selected memory cell according to the magnitude of the reference current $I_{REF}$ and the magnitude of the read current.

In case that the P/E count of the memory cell is higher than $S_1$ and lower than $S_2$, the characteristics of the memory cell are gradually degraded with the increasing P/E count. For example, $S_1$ is 300, and $S_2$ is 1000. As the P/E count increases, the magnitude of the read current $I_{RD\_P}$ generated by the memory cell in the program state gradually decreases, and the magnitude of the read current $I_{RD\_E}$ generated by the memory cell in the erase state gradually increases. Under this circumstance, the data sensor 350 can still judge the storage state of the memory cell according to the magnitude of the reference current $I_{REF}$ and the magnitude of the read current.

In case that the P/E count of the memory cell is higher than $S_2$ (for example, the P/E count is higher than 1000), the magnitude of the read current $I_{RD\_P}$ generated by the memory cell in the program state is lower than the reference current $I_{REF}$. When the read action is performed, the memory cell in the program state may be erroneously determined as the erase state by the data sensor 350. In other words, a read failure problem occurs.

As mentioned above, after the conventional non-volatile memory leaves the factory, the characteristics of the memory cell is gradually deteriorated. Therefore, it is important to continuously and accurately judge the storage state of the memory cell during the deterioration process of the memory cell. Consequently, the life time of the non-volatile memory can be extended.

SUMMARY OF THE INVENTION

An embodiment of the present invention provides a control gate voltage generating circuit for a non-volatile memory cell. The non-volatile memory includes an array structure. The array structure is connected with a source line and a control gate line. The control gate voltage generating circuit is connected with the control gate line. The control gate voltage generating circuit includes 2N reference memory cells, wherein first terminals of the 2N reference memory cells are connected with the source line, control gate terminals of the 2N reference memory cells are connected with the control gate line, select gate terminals of the 2N reference memory cells are connected with a reference word line, and second terminals of the 2N reference memory cells are respectively connected with 2N reference bit lines, wherein N is a positive integer; a switching circuit connected with the 2N reference bit lines, wherein when a read action is performed, a first read voltage is provided to the source line, an on voltage is provided to the reference word line, the 2N reference bit lines are connected with a first node through the switching circuit, and the 2N reference memory cells generate a total current flowed to the first node, wherein the total current is a sum of plural read currents generated by a first number of the reference memory cells in a program state and the read currents generated by a second number of the reference memory cells in an erase state, wherein the sum of the first number and the second number is equal to 2N; a current mirror, wherein a current input terminal of the current mirror receives a reference current, and a current mirroring terminal of the current mirror is connected with the first node to receive the total current, wherein a ratio of the reference current to the total current is 1/(2N); and, a voltage tracking circuit comprising a first input terminal, a second input terminal and an output terminal, wherein the first input terminal of the voltage tracking circuit receives a second read voltage, the second input terminal of the voltage tracking circuit is connected with the first node, and the output terminal of the voltage tracking circuit generates a first control gate voltage, and the first control gate voltage is transmitted to the control gate line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3 (prior art) schematically illustrates the architecture of a conventional non-volatile memory;

FIG. 4 (prior art) is a plot illustrating the relationship between the program/erase cycling time (P/E count) and the read current for the conventional memory cell;

DETAILED DESCRIPTION OF PREFERRED EMBODIMENTS

The present invention provides a control gate voltage generating circuit for a non-volatile memory. The control gate voltage generating circuit can be used to replace the control gate voltage generator 320 shown in FIG. 3. The control gate voltage generating circuit, associated circuits and an array structure are collaboratively formed as the non-volatile memory.

Generally, when the read action is performed, the gate control voltage $V_{CG\_RD}$ and the amount of carriers stored in the charge storage layer 23 affect the turn-on situation of the memory transistor $M_M$ in the memory cell, and the turn-on situation of the memory transistor $M_M$ is related to the magnitude of the read current.

In the present invention, the control gate voltage $V_{CG\_RD}$ is appropriately adjusted by the control gate voltage generating circuit according to the characteristics changes of the memory cells after the non-volatile memory leaves the factory. When the read action is performed, the reference current $I_{REF}$ is a constant current, and the control gate voltage generating circuit provides the adjusted control gate voltage $V_{CG\_RD}$ to the control gate line CGL of the array structure. The adjusted control gate voltage $V_{CG\_RD}$ forces the read current $I_{RD\_E}$ from the array structure in the erase state lower than the reference current $I_{REF}$ and forces the read current $I_{RD\_P}$ from the array structure in the program state higher than the reference current $I_{REF}$. Consequently, the magnitude of the reference current $I_{REF}$ is maintained in the range between the read current $I_{RD\_E}$ in the erase state and the read current $I_{RD\_P}$ in the program state. Consequently, the storage state of the selected memory cell can be accurately determined, and the life time of the non-volatile memory will be extended.

Figures 5, 6:
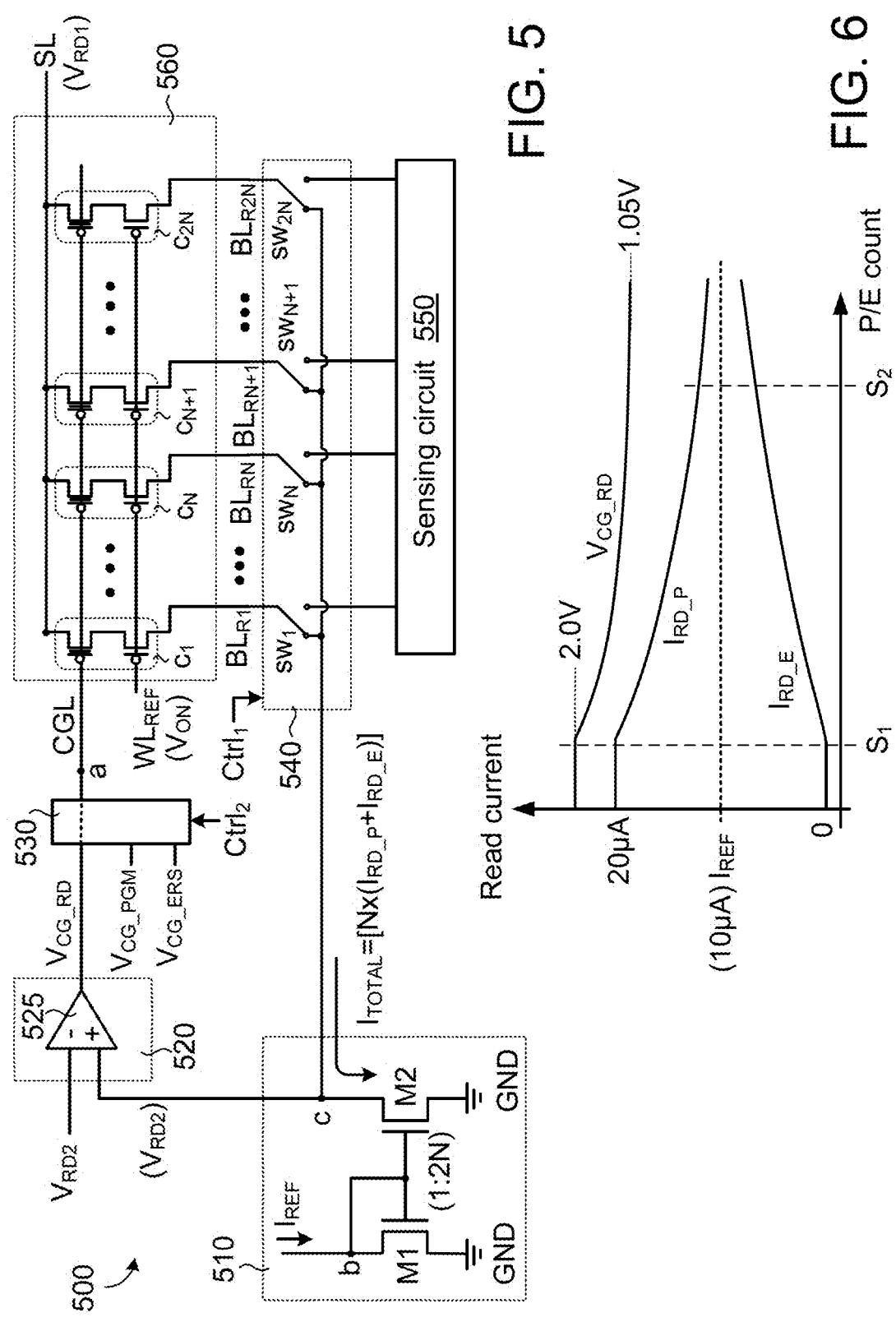
FIG. 5 is a schematic circuit diagram illustrating a control gate voltage generating circuit according to a first embodiment of the present invention.
FIG. 6 is a plot illustrating the relationship between the program/erase cycling time (P/E count) and the read current for the memory cell of the present invention.

FIG. 5 is a schematic circuit diagram illustrating a control gate voltage generating circuit according to a first embodiment of the present invention.

Figures 1A, 1B, 2A, 2B:
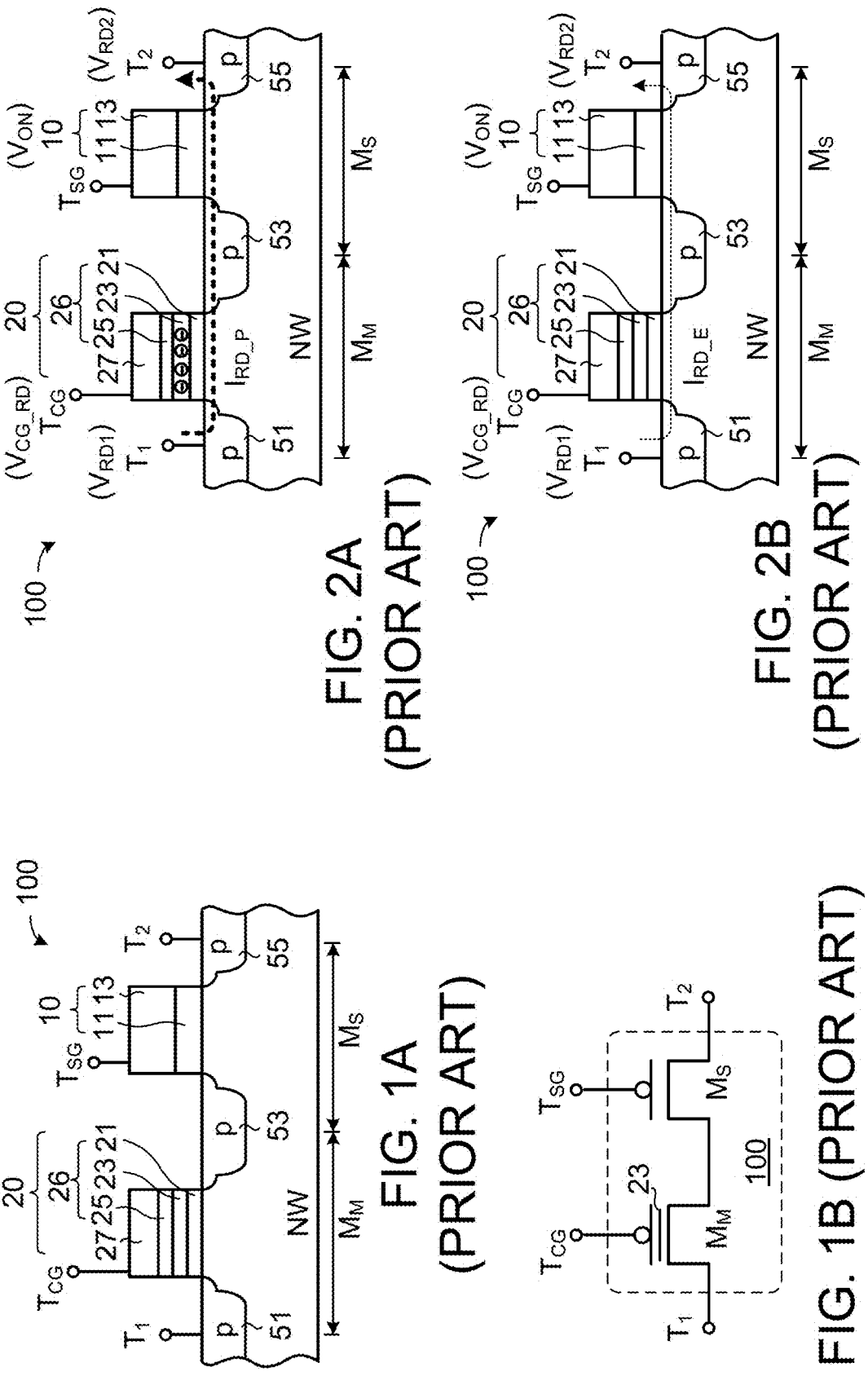
FIG. 1A (prior art) is a schematic cross-sectional view illustrating a memory cell.
FIG. 1B (prior art) is an equivalent circuit of the memory cell shown in FIG. 1B.
FIG. 2A (prior art) schematically illustrates the bias voltages for performing a read action on the memory cell shown in FIG. 1A, in which the memory cell is in the program state.
FIG. 2B (prior art) schematically illustrates the bias voltages for performing a read action on the memory cell shown in FIG. 1A, in which the memory cell is in the erase state.

As shown in FIG. 5, the control gate voltage generating circuit 500 comprises a current mirror 510, a voltage tracking circuit 520, a selecting circuit 530, 2N reference memory cells $c_1 \sim c_{2N}$, a switching circuit 540 and a sensing circuit 550. The 2N reference memory cells $c_1 \sim c_{2N}$ are included in an array structure 560 of the non-volatile memory. In other words, the array structure 560 of the non-volatile memory may include two portions. The first portion includes X×Y memory cells $c_{1,1} \sim c_{X,Y}$ (not shown) and the second portion includes 2N reference memory cells $c_1 \sim c_{2N}$. The circuitry of the first portion is similar to the X×Y memory cells $c_{1,1} \sim c_{X,Y}$ of FIG. 3, and not redundantly described herein. The structure of each of the reference memory cells $c_1 \sim c_{2N}$ is identical to the structure of the memory cell shown in FIGS. 1A and 1B, and not redundantly described herein. Moreover, N is a positive integer. For example, N is equal to 8.

The first terminals of the 2N reference memory cells $c_1 \sim c_{2N}$ are connected with a source line SL. The second terminals of the 2N reference memory $c_1 \sim c_{2N}$ are respectively connected with corresponding reference bit lines $BL_{R1} \sim BL_{R2N}$. The select gate terminals of the 2N reference memory cells $c_1 \sim c_{2N}$ are connected with a reference word line $WL_{REF}$. The control gate terminals of the 2N reference memory cells $c_1 \sim c_{2N}$ are connected with a control gate line CGL. In addition, the control gate line CGL is connected with a node a.

The switching circuit 540 receives a control signal $Ctrl_1$. The switching circuit 540 comprises 2N switches $sw_1 \sim sw_{2N}$. The first terminals of the 2N switches $sw_1 \sim sw_{2N}$ are respectively connected with the corresponding 2N reference bit lines $BL_{R1} \sim BL_{R2N}$. The second terminals of the 2N switches $sw_1 \sim sw_{2N}$ are connected with a node c. The third terminals of the 2N switches $sw_1 \sim sw_{2N}$ are connected with the sensing circuit 550. The 2N switches $sw_1 \sim sw_{2N}$ are operated according to the control signal $Ctrl_1$. For example, when the read action is performed, the first terminals of the 2N switches $sw_1 \sim sw_{2N}$ are respectively connected with the second terminals of the 2N switches $sw_1 \sim sw_{2N}$ according to the control signal $Ctrl_1$. Furthermore, when the program action or the erase action is performed, the first terminals of the 2N switches $sw_1 \sim sw_{2N}$ are respectively connected with the third terminals of the 2N switches $sw_1 \sim sw_{2N}$ according to the control signal $Ctrl_1$. That is, when the read action is performed, the reference bit lines $BL_{R1} \sim BL_{R2N}$ are all connected with the node c. Whereas, when the program action (including a program verification operation) or the erase action (including an erase verification operation) are performed, the reference bit lines $BL_{R1} \sim BL_{R2N}$ are all connected with the sensing circuit 550 for the program verification operation and the erase verification operation.

The current mirror 510 comprises a current input terminal and a current mirroring terminal. The current input terminal is connected with a node b. The current mirroring terminal is connected with the node c. In addition, the current input terminal receives a reference current $I_{REF}$. The current mirror 510 comprises two transistors M1 and M2. The ratio of the size of the transistors M1 to the size of the transistor M2 is 1:2N. The first drain/source terminal of the transistor M1 is connected with the node b. The second drain/source terminal of the transistor M1 is connected with the ground terminal GND. The gate terminal of the transistor M1 is connected with the node b. The first drain/source terminal of the transistor M2 is connected with the node c. The second drain/source terminal of the transistor M2 is connected with the ground terminal GND. The gate terminal of the transistor M2 is connected with the node b.

The voltage tracking circuit 520 is connected with the node c. In addition, the voltage tracking circuit 520 receives a second read voltage $V_{RD2}$. When the read action is performed, the voltage tracking circuit 520 outputs a control gate voltage $V_{CG\_RD}$. For example, the voltage tracking circuit 520 comprises an operational amplifier 525. The negative input terminal of the operational amplifier 525 receives the second read voltage $V_{RD2}$. The positive input terminal of the operational amplifier 525 is connected with the node c. The output terminal of the operational amplifier 525 generates the control gate voltage $V_{CG\_RD}$. Generally, the operational amplifier 525 generates the control gate voltage $V_{CG\_RD}$ according to the voltage difference between the positive input terminal and the negative input terminal.

The selecting circuit 530 has three input terminals. The first input terminal, the second input terminal and the third input terminal of the selecting circuit 530 receive the control gate voltages $V_{CG\_RD}$, $V_{CG\_PGM}$ and $V_{CG\_ERS}$, respectively. The control terminal of the selecting circuit 530 receives a control signal $Ctrl_2$. The output terminal of the selecting circuit 530 is connected with the node a. According to the control signal $Ctrl_2$, one of the three control gate voltages $V_{CG\_RD}$, $V_{CG\_PGM}$ and $V_{CG\_ERS}$ is selected to be transmitted to the node a by the selecting circuit 530. The node a is the output terminal of the control gate voltage generating circuit 500. For example, when the read action is performed, the first input terminal of the selecting circuit 530 is connected with the node a, and the control gate voltage $V_{CG\_RD}$ for read is outputted from the control gate voltage generating circuit 500 to the control gate line CGL. When the program action is performed, the second input terminal of the select circuit 530 is connected with the node a, and the control gate voltage $V_{CG\_PGM}$ for program is outputted from the control gate voltage generating circuit 500 to the control gate line CGL. When the erase action is performed, the third input terminal of the selecting circuit 530 is connected with the node a, and the control gate voltage $V_{CG\_ERS}$ for erase is outputted from the control gate voltage generating circuit 500 to the control gate line CGL.

When the program action is performed, the control gate voltage generating circuit 500 generates a control gate voltage $V_{CG\_PGM}$. The control gate voltage $V_{CG\_PGM}$ is transmitted to the array structure 560 of the non-volatile memory through the control gate line CGL. Consequently, the program action can be performed. When the erase action is performed, the control gate voltage generating circuit 500 generates a control gate voltage $V_{CG\_ERS}$. The control gate voltage $V_{CG\_ERS}$ is transmitted to the array structure 560 of the non-volatile memory through the control gate line CGL.

Consequently, the erase action can be performed. In other words, when the program action or the erase action is performed, the operations of the control gate voltage generating circuit 500 of this embodiment are similar to the operations of the control gate voltage generator 320 of the non-volatile memory 300 shown in FIG. 3.

As mentioned above, the reference memory cells $c_1 \sim c_{2N}$ are included in the array structure 560. Consequently, when the program action is performed, the reference word line $WL_{REF}$ and the reference bit lines $BL_{R1} \sim BL_{R2N}$ can be activated to selectively program portions of the reference memory cells $c_1 \sim c_{2N}$. Similarly, when the erase action is performed, the reference memory cells $c_1 \sim CEN$ are changed to the erase state. Moreover, when the program action or the erase action is performed, the operations of the sensing circuit 550 are similar to the operations of the data sensor 350 shown in FIG. 3. In the first embodiment, N reference memory cells of the 2N reference memory cells $c_1 \sim c_{2N}$ are programmed to the program state, and the other N reference memory cells of the 2N reference memory cells $c_1 \sim c_{2N}$ are erased to the erase state. For example, the N reference memory cells $c_1 \sim c_N$ are in the program state, and the other N reference memory cells $c_{N+1} \sim c_{2N}$ are in the erase state.

When the read action is performed, the control gate voltage generating circuit 500 adaptively adjusts the control gate voltage $V_{CG\_RD}$ according to the changes of the characteristics of the memory cell to force the read current $I_{RD\_E}$ lower than the reference current $I_{REF}$ and to force the read current $I_{RD\_P}$ higher than the reference current $I_{REF}$. The operations of the control gate voltage generating circuit 500 during the read action will be described as follows.

Please refer to FIG. 5 again. When the read action is performed, the source line SL receives the first read voltage $V_{RD1}$. Moreover, the on voltage $V_{ON}$ is provided to the reference word line $WL_{REF}$ to activate the reference word line $WL_{REF}$. Consequently, the select transistors in the 2N reference memory cells $c_1 \sim c_{2N}$ are turned on. Moreover, the output terminal of the operational amplifier 525 is connected with the node a through the selecting circuit 530. In addition, all reference bit lines $BL_{R1} \sim BL_{R2N}$ are connected with the node c through the switching circuit 540. That is, when the read action is performed, the 2N reference bit lines $BL_{R1} \sim BL_{R2N}$ are connected with the current mirroring terminal of the current mirror 510.

In the 2N reference memory cells $c_1 \sim c_{2N}$, the N reference memory cells $c_1 \sim c_N$ are in the program state, and the other N reference memory cells $c_{N+1} \sim c_{2N}$ are in the erase state. Consequently, the total current $I_{TOTAL}$ generated by the 2N reference memory cells $c_1 \sim c_{2N}$ is equal to $[N \times (I_{RD\_P} + I_{RD\_E})]$. That is, the total current $I_{TOTAL}$ is the sum of the read currents $I_{RD\_P}$ generated by the N reference memory cells in the program state and the read currents $I_{RD\_E}$ generated by the N memory cells in the erase state.

As known, the input impedance of the operational amplifier 525 is infinite. Consequently, the total current $I_{TOTAL}$ will not flow into the positive input terminal of the operational amplifier 525. That is, the total current $I_{TOTAL}$ flows into the current mirroring terminal of the current mirror 510.

In the current mirror 510, the ratio of the size of the transistor M1 to the size of the transistor M2 is 1:2N. Consequently, the ratio of the reference current $I_{REF}$ to the total current $I_{TOTAL}$ is (1/2N). That is, $2N \times I_{REF} = N \times (I_{RD\_P} + I_{RD\_E})$. Consequently, $(I_{RD\_P} + I_{RD\_E})/2 = I_{REF}$.

Due to the negative feedback, the voltage at the positive input terminal of the operational amplifier 525 and the voltage at the negative input terminal of the operational amplifier 525 are finally nearly equal. That is, the voltage on each of the 2N reference bit lines $BL_{R1} \sim BL_{R2N}$ is finally equal to the second read voltage $V_{RD2}$.

According to the embodiment of the present invention, the control gate voltage $V_{CG\_RD}$ is adjusted by the negative feedback amplifier 525 to control the magnitudes of the read currents of the 2N reference memory cells $c_1 \sim c_{2N}$. Moreover, the read currents generated by the 2N reference memory cells $c_1 \sim c_{2N}$ are controlled to achieve the ratio relationship between the current input terminal and the current mirroring terminal of the current mirror 510 by the negative feedback amplifier 525. That is, when the voltage on each of the 2N reference bit lines $BL_{R1} \sim BL_{R2N}$ is equal to the second read voltage $V_{RD2}$, the relationship of $(I_{RD\_P} + I_{RD\_E})/2 = I_{REF}$ is maintained.

Obviously, Since the read current $I_{RD\_P}$ in the program state is larger than the read current $I_{RD\_E}$ in the erase state, using the control gate voltage $V_{CG\_RD}$ to control the magnitudes of the read current $I_{RD\_P}$ in the programming state and the read current $I_{RD\_E}$ in the erase state ensures that the magnitude of the reference current $I_{REF}$ will be between the read current $I_{RD\_P}$ and the read current $I_{RD\_E}$.

Moreover, the adjusted control gate voltage $V_{CG\_RD}$ is transmitted to the node a. Consequently, the adjusted control gate voltage $V_{CG\_RD}$ is outputted from the control gate voltage generating circuit 500 to the selected memory cell in the array structure 560 through the control gate line CGL. Consequently, in case that the selected memory cell is in the program state, the read current $I_{RD\_P}$ is higher than the reference current $I_{REF}$. Whereas, in case that the selected memory cell is in the erase state, the read current $I_{RD\_E}$ is lower than the reference current $I_{REF}$. That is, the storage state of the selected memory cell can be accurately judged according to the magnitude of the reference current $I_{REF}$.

As mentioned above, when the read action is performed, the control gate voltage $V_{CG\_RD}$ outputted from the voltage tracking circuit 520 is determined according to the characteristics of the 2N reference memory cells $c_1 \sim c_{2N}$. It is ensured that the 2N reference memory cells $c_1 \sim CON$ in the non-volatile memory have the inferior characteristics. Consequently, the control gate voltage generating circuit 500 can output the proper control gate voltage $V_{CG\_RD}$ to the control gate line CGL and the control gate voltage $V_{CG\_RD}$ at the control gate line CGL is transmitted to the X×Y memory cells $c_{1,1} \sim c_{X,Y}$ of the first portion in the array structure 560 for the read action and may be further for the program verification operation and the erase verification operation.

When the erase action is performed on the memory cells $c_{1,1} \sim c_{X,Y}$ in the array structure 560 of the non-volatile memory, the 2N reference memory cells $c_1 \sim c_{2N}$ in the array structure 560 also need to be subjected to the erase action. In order to make the 2N reference memory cells $c_1 \sim c_{2N}$ have the inferior characteristics, the N reference memory cells in the erase state can be firstly programmed to the program state so that all 2N reference memory cells $c_1 \sim c_{2N}$ are in the program state. Then, the erase action is performed on the 2N programmed reference memory cells $c_1 \sim c_{2N}$ to ensure that the P/E count of the 2N reference memory cells $c_1 \sim c_{2N}$ is increased by one. After the erase action is completed, N reference memory cells of the non-volatile memory are subjected to the program action and programmed to the program state, and the other N reference memory cells of the non-volatile memory are maintained in the erase state thus the N reference memory cells of the 2N reference memory cells $c_1 \sim c_{2N}$ are maintained in the program state, and the other N reference memory cells are maintained in the erase state. That is, in comparison with the X×Y memory cells $c_{1,1} \sim c_{X,Y}$ in the array structure 560, the P/E count of the 2N reference memory cells $c_1 \sim c_{2N}$ is larger, indicating that the 2N reference memory cells $c_1 \sim c_{2N}$ have the inferior characteristics.

FIG. 6 is a plot illustrating the relationship between the program/erase cycling time (P/E count) and the read current for the memory cell of the present invention.

In case that the P/E count of the memory cell is very low (e.g., lower than $S_1$), the memory cell has the better characteristics. For example, $S_1$ is 300. Consequently, the read current $I_{RD\_P}$ generated by the memory cell in the program state is about 20 µA, and the read current $I_{RD\_E}$ generated by the memory cell in the erase state is very low (e.g., nearly zero). The gate control voltage $V_{CG\_RD}$ is almost kept unchanged (e.g., maintained at 2.0V). Under this circumstance, the storage state of the selected memory cell can be accurately judged according to the magnitude of the reference current $I_{REF}$ and the magnitude of the read current.

In case that the P/E count of the memory cell is higher than $S_1$ and lower than $S_2$, the characteristics of the memory cell are gradually degraded with the increasing P/E count. For example, $S_1$ is 300, and $S_2$ is 1000. As the P/E count increases, the magnitude of the read current $I_{RD\_P}$ generated by the memory cell in the program state gradually decreases, and the magnitude of the read current $I_{RD\_E}$ generated by the memory cell in the erase state gradually increases. Meanwhile, the control gate voltage $V_{CG\_RD}$ gradually decreases. Under this circumstance, the storage state of the memory cell can be accurately judged according to the magnitude of the reference current $I_{REF}$ and the magnitude of the read current.

In case that the P/E count of the memory cell is higher than $S_2$ (for example, the P/E count is higher than 1000), the control gate voltage $V_{CG\_RD}$ deceases to about 1.05V to further turn on the floating gate transistor of the memory cell. Consequently, the storage state of the memory cell can still be accurately judged according to the magnitude of the reference current $I_{REF}$ and the magnitude of the read current.

From the above descriptions, the present invention provides a control gate voltage generating circuit for a non-volatile memory. After the non-volatile memory leaves the factory, the control gate voltage $V_{CG\_RD}$ is appropriately adjusted by the control gate voltage generating circuit according to the characteristics changes of the memory cells. When the read action is performed, the control gate voltage generating circuit provides the adjusted control gate voltage $V_{CG\_RD}$ to the control gate line CGL of the array structure 560. The magnitude of the reference current $I_{REF}$ can be maintained in the range between the read current $I_{RD\_E}$ in the erase state and the read current $I_{RD\_P}$ in the program state. Consequently, the storage state of the selected memory cell can be accurately determined, and the life time of the non-volatile memory will be extended.

According to the first embodiment, half of the 2N reference memory cells $c_1 \sim c_{2N}$ of the control gate voltage generating circuit 500 are controlled in the program state, and the other N reference memory cells are controlled in the erase state. In fact, the present invention does not limit the number of the reference memory cells in the program state to be the same as the number of the reference memory cells in the erase state. It only needs to set a specific proportional relationship between the reference memory cells in the program state and the reference memory cells in the erase state. For example, a first number of reference memory cells are controlled to be in the program state, and a second number of the reference memory cells are controlled to be in the erase state. The first number and the second number are both integers greater than zero. The first number and the second number may be equal or unequal. The sum of the first number and the second number is equal to 2N. In addition, the total current $I_{TOTAL}$ generated by 2N reference memory cells is input to the current mirror 510 during the read action. Therefore, the control gate voltage $V_{CG\_RD}$ is adjusted accordingly, so that the storage state of the selected memory cell can be accurately determined.

Furthermore, the operating principles of the switching circuit 540 are similar to those of the bit line driver in the non-volatile memory. Consequently, in a variant example, the switching circuit can be included in the bit line driver. Similarly, the operating principles of the sensing circuit 550 are similar to those of the data sensor in the non-volatile memory. Consequently, in a variant example, the sensing circuit 550 can be included in the data sensor.

In the embodiment shown in FIG. 5, the voltage tracking circuit 520 is implemented with the operational amplifier 525. It is noted that numerous modifications and alterations may be made while retaining the teachings of the invention. For example, in some other embodiments, the voltage tracking circuit is implemented with a digital circuit.

Figure 7:
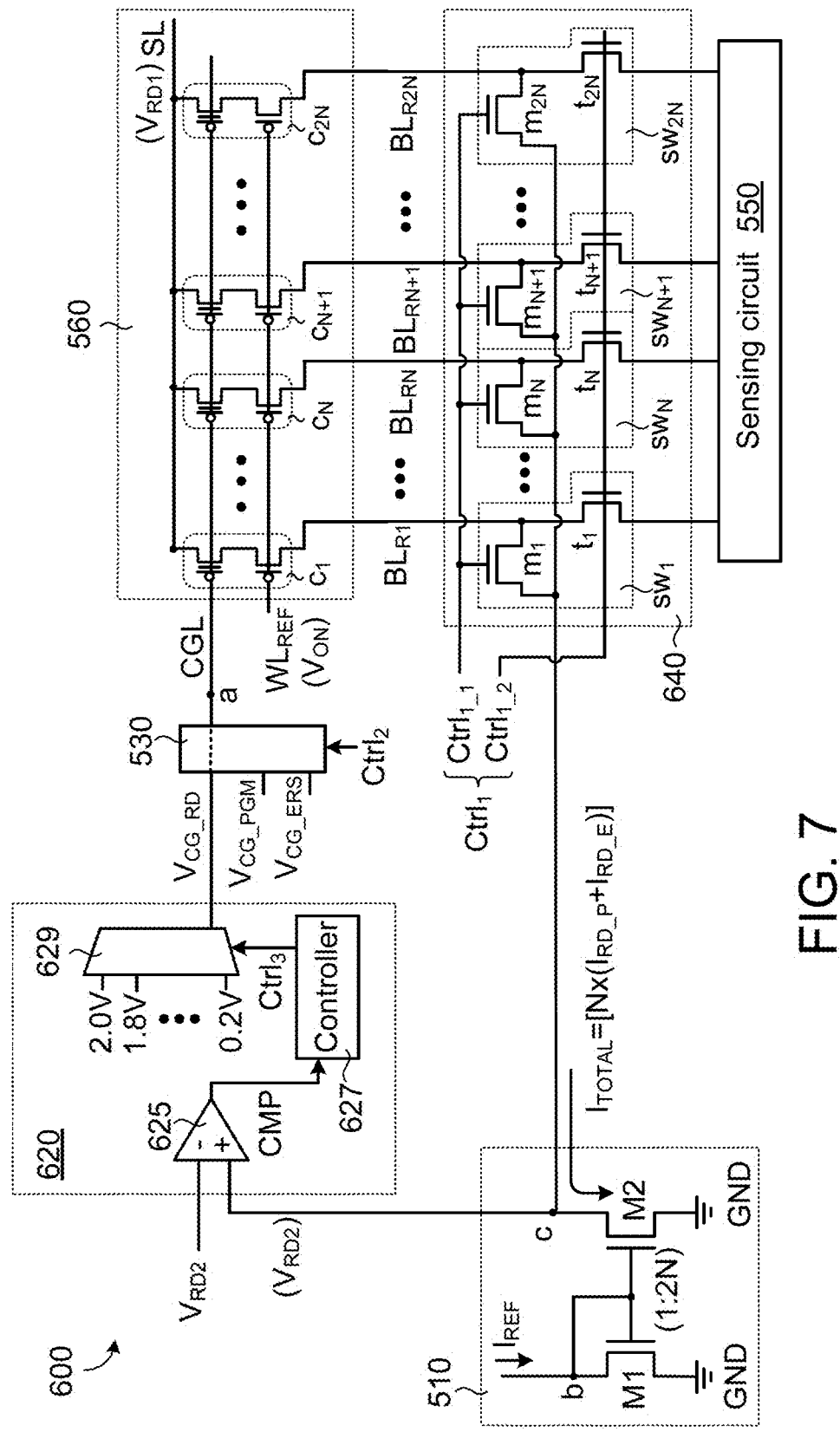
FIG. 7 is a schematic circuit diagram illustrating a control gate voltage generating circuit according to a second embodiment of the present invention.

FIG. 7 is a schematic circuit diagram illustrating a control gate voltage generating circuit according to a second embodiment of the present invention.

As shown in FIG. 7, the control gate voltage generating circuit 600 comprises a current mirror 510, a voltage tracking circuit 620, a selecting circuit 530, 2N reference memory cells $c_1 \sim c_{2N}$, a switching circuit 640 and a sensing circuit 550. In comparison with the first embodiment, the circuitry structure of the voltage tracking circuit 620 in the control gate voltage generating circuit of this embodiment is distinguished. In addition, the detailed circuitry structure of the switch circuit 640 in the control gate voltage generating circuit of the second embodiment is shown. In some other embodiments, the switch circuit is implemented with other electronic components. For succinctness, only the voltage tracking circuit 620 and the switching circuit 640 will be described as follows. The other circuitry structures are similar to those in the first embodiment, and not redundantly described herein.

The switching circuit 640 receives a control signal $Ctrl_1$. The control signal $Ctrl_1$ contains two sub-control signal $Ctrl_{1\_1}$ and $Ctrl_{1\_2}$. The switching circuit 640 comprises 2N switches $sw_1 \sim sw_{2N}$. The circuitry structures of the 2N switches $sw_1 \sim sw_{2N}$ are identical. The switch $sw_1$ comprises two transistors $m_1$ and $t_1$. The switch $sw_N$ comprises two transistors $m_N$ and $t_N$. The switch $sw_{N+1}$ comprises two transistors $m_{N+1}$ and $t_{N+1}$. The switch $sw_{2N}$ comprises two transistors $m_{2N}$ and $t_{2N}$.

Take the switch $sw_1$ for example. The first drain/source terminal of the transistor $m_1$ is connected with the reference bit line $BL_{R1}$. The second drain/source terminal of the transistor $m_1$ is connected with the node c. The gate terminal of the transistor $m_1$ receives the sub-control signal $Ctrl_{1\_1}$. The first drain/source terminal of the transistor $t_1$ is connected with the reference bit line $BL_{R1}$. The second drain/source terminal of the transistor $t_1$ is connected with the sensing circuit 550. The gate terminal of the transistor $t_1$ receives the sub-control signal $Ctrl_{1\_2}$. When the read action is performed, the sub-control signal $Ctrl_{1\_1}$ is activated, and the sub-control signal $Ctrl_{1\_2}$ is not activated. Consequently, all of the reference bit lines $BL_{R1} \sim BL_{R2N}$ are connected with the node c. When the program action or the erase action is performed, the sub-control signal $Ctrl_{1\_1}$ is not activated, and the sub-control signal $Ctrl_{1\_2}$ is activated. Consequently, all of the reference bit lines $BL_{R1} \sim BL_{R2N}$ are connected with the sensing circuit 550.

The voltage tracking circuit 620 is connected with the node c. In addition, the voltage tracking circuit 620 receives the second read voltage $V_{RD2}$. When the read action is performed, the voltage tracking circuit 620 outputs the control gate voltage $V_{CG\_RD}$. In this embodiment, the voltage tracking circuit 620 comprises a comparator 625, a controller 627 and a multiplexer 629.

The negative input terminal of the comparator 625 receives the second read voltage $V_{RD2}$. The positive input terminal of the comparator 625 is connected with the node c. The output terminal of the comparator 625 generates a comparison output signal CMP. That is, the comparator 625 generates the comparison output signal CMP according to the voltage difference between the positive input terminal and the negative input terminal. The controller 627 receives the comparison output signal CMP. According to the comparison output signal CMP, controller 627 generates a control signal $Ctrl_3$ to the multiplexer 629. Moreover, the multiplexer 629 has plural input terminals. The plural input terminals respectively receive plural different input voltages (e.g., 2.0V, 1.8V, . . . , and 0.2V). The output terminal of the multiplexer 629 is connected with the first input terminal of the selecting circuit 530. According to the control signal $Ctrl_3$ from the controller 627, one of the plural input voltages is transmitted to the output terminal of the multiplexer 629 and served as the control gate voltage $V_{CG\_RD}$.

For example, if the voltage at the positive input terminal of the comparator 625 (i.e., the voltage at the node c) is lower than the second read voltage $V_{RD2}$ when the read action is performed, the controller 627 controls to the multiplexer 629 to decrease the outputted control gate voltage $V_{CG\_RD}$ according to the comparison output signal CMP. Consequently, the total current $I_{TOTAL}$ is increased. Whereas, if the voltage at the positive input terminal of the comparator 625 (i.e., the voltage at the node c) is higher than the second read voltage $V_{RD2}$ when the read action is performed, the controller 627 controls to the multiplexer 629 to increase the outputted control gate voltage $V_{CG\_RD}$ according to the comparison output signal CMP. Consequently, the total current $I_{TOTAL}$ is decreased.

Consequently, when the read action is performed, the control gate voltage generating circuit 600 adaptively adjusts the control gate voltage $V_{CG\_RD}$.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control gate voltage generating circuit for a non-volatile memory, the non-volatile memory comprising an array structure, the array structure being connected with a source line and a control gate line, the control gate voltage generating circuit being connected with the control gate line, the control gate voltage generating circuit comprising:

2N reference memory cells, wherein first terminals of the 2N reference memory cells are connected with the source line, control gate terminals of the 2N reference memory cells are connected with the control gate line, select gate terminals of the 2N reference memory cells are connected with a reference word line, and second terminals of the 2N reference memory cells are respectively connected with 2N reference bit lines, wherein N is a positive integer;

a switching circuit connected with the 2N reference bit lines, wherein when a read action is performed, a first read voltage is provided to the source line, an on voltage is provided to the reference word line, the 2N reference bit lines are connected with a first node through the switching circuit, and the 2N reference memory cells generate a total current flowed to the first node, wherein the total current is a sum of plural read currents generated by a first number of the reference memory cells in a program state and the read currents generated by a second number of the reference memory cells in an erase state, wherein the sum of the first number and the second number is equal to 2N;

a current mirror, wherein a current input terminal of the current mirror receives a reference current, and a current mirroring terminal of the current mirror is connected with the first node to receive the total current, wherein a ratio of the reference current to the total current is 1/(2N); and a voltage tracking circuit comprising a first input terminal, a second input terminal and an output terminal, wherein the first input terminal of the voltage tracking circuit receives a second read voltage, the second input terminal of the voltage tracking circuit is connected with the first node, and the output terminal of the voltage tracking circuit generates a first control gate voltage, and the first control gate voltage is transmitted to the control gate line.

2. The control gate voltage generating circuit as claimed in claim 1 further comprises:

a selecting circuit, wherein a first input terminal of the selecting circuit is connected with the output terminal of the voltage tracking circuit, and an output terminal of the selecting circuit is connected with the control gate line, wherein when the read action is performed, the first terminal of the selecting circuit is connected with the output terminal of the selecting circuit, so that the first control gate voltage is transmitted to the control gate line for the read action.

3. The control gate voltage generating circuit as claimed in claim 2, wherein the selecting circuit further comprises:

a second input terminal receiving a second control gate voltage; and a third input terminal receiving a third control gate voltage, wherein when a program action is performed, the second terminal of the selecting circuit is connected with the output terminal of the selecting circuit, so that the control gate line outputs the second control gate voltage for the program action, wherein when an erase action is performed, the third terminal of the selecting circuit is connected with the output terminal of the selecting circuit, so that the control gate line outputs the third control gate voltage for the erase action.

4. The control gate voltage generating circuit as claimed in claim 1, wherein a first reference memory cell of the 2N reference memory cells comprises:

a memory transistor, wherein a first drain/source terminal of the memory transistor is the first terminal of the first reference memory cell, and a control gate of the memory transistor is the control gate terminal of the first reference memory cell; and

a select transistor, wherein a first drain/source terminal of the select transistor is connected with a second drain/source terminal of the memory transistor, a second drain/source terminal of the select transistor is the second terminal of the first reference memory cell, and a select gate of the select transistor is the select gate terminal of the first reference memory cell.

5. The control gate voltage generating circuit as claimed in claim 4, wherein the memory transistor is a charge-trap transistor or a floating gate transistor.

6. The control gate voltage generating circuit as claimed in claim 1, wherein in the 2N reference memory cells, N reference memory cells are in the program state, and the other N memory cells are in the erase state, wherein the total current is a sum of the read currents generated by the N reference memory cells in the program state and the read currents generated by the N memory cells in the erase state.

7. The control gate voltage generating circuit as claimed in claim 6, wherein when an erase action is performed on plural memory cells in the array structure, the erase action is also performed on the 2N reference memory cells, wherein after the erase action is completed, the N reference memory cells of the 2N reference memory cells are subjected to a program action and programmed to the program state, and the other N reference memory cells of the 2N reference memory cells are maintained in the erase state.

8. The control gate voltage generating circuit as claimed in claim 1, wherein the current mirror comprises:

a first transistor, wherein a first drain/source terminal of the first transistor is the current input terminal of the current mirror, a second drain/source terminal of the first transistor is connected with a ground terminal, and a gate terminal of the first transistor is connected with the first drain/source terminal of the first transistor; and a second transistor, wherein a first drain/source terminal of the second transistor is the current mirroring terminal of the current mirror, a second drain/source terminal of the second transistor is connected with the ground terminal, and a gate terminal of the second transistor is connected with the gate terminal of the first transistor, wherein a ratio of a size of the first transistor to a size of the transistor is 1:2N.

9. The control gate voltage generating circuit as claimed in claim 1, wherein the voltage tracking circuit comprises an operational amplifier, wherein a negative input terminal of the operational amplifier receives the second read voltage, a positive input terminal of the operational amplifier is connected with the first node, and an output terminal of the operational amplifier generates the first control gate voltage.

10. The control gate voltage generating circuit as claimed in claim 1, wherein the voltage tracking circuit comprises:

a comparator, wherein a negative input terminal of the comparator receives the second read voltage, a positive input terminal of the comparator is connected with the first node, and an output terminal of the comparator generates a comparison output signal;

a controller receiving the comparison output signal and generating a control signal; and a multiplexer with plural input terminals, wherein the plural input terminals of the multiplexer respectively receive plural input voltages, wherein according to the control signal, one of the plural input voltages is transmitted to an output terminal of the multiplexer and served as the control gate voltage.

11. The control gate voltage generating circuit as claimed in claim 1, wherein the control gate voltage generating circuit further comprises a sensing circuit for receiving the reference current, and the sensing circuit is connected with the switching circuit, wherein when a program action or an erase action is performed, the 2N reference bit lines are connected with the sensing circuit through the switching circuit.

12. The control gate voltage generating circuit as claimed in claim 11, wherein the switching circuit comprises 2N switches, wherein first terminals of the 2N switches are respectively connected with the corresponding 2N reference bit lines, second terminals of the 2N switches are connected with the first node, and third terminals of the 2N switches are connected with the sensing circuit, wherein when the read action is performed, the first terminal and the second of each of the 2N switches are connected with each other, wherein when a program action or an erase action is performed, the first terminal and the third terminal of each of the 2N switches are connected with each other.

13. The control gate voltage generating circuit as claimed in claim 12, wherein a first switch of the 2N switches comprises:

a first transistor, wherein a first drain/source terminal of the first transistor is connected with a first reference bit line of the N reference bit lines, a second drain/source terminal of the first transistor is connected with the first node, and a gate terminal of the first transistor receives a first sub-control signal; and a second transistor, wherein a first drain/source terminal of the second transistor is connected with the first reference bit line, a second drain/source terminal of the second transistor is connected with the sensing circuit, and a gate terminal of the second transistor receives a second sub-control signal, wherein when the read action is performed, the first sub-control signal is activated, the second sub-control signal is not activated, so that the first reference bit line is connected with the first node;

wherein when the program action or the erase action is performed, the first sub-control signal is not activated, and the second sub-control signal is activated, so that the first reference bit line is connected with the sensing circuit.

* * * * *